(12) United States Patent
Nagashima et al.

(10) Patent No.: US 9,653,314 B2
(45) Date of Patent: May 16, 2017

(54) SEMICONDUCTOR DEVICE AND MANUFACTURING METHOD THEREOF

(71) Applicant: KABUSHIKI KAISHA TOSHIBA, Minato-ku (JP)

(72) Inventors: Satoshi Nagashima, Yokkaichi (JP); Koichi Matsuno, Mie (JP); Takashi Sugihara, Yokkaichi (JP); Hiroaki Naito, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/572,940

(22) Filed: Dec. 17, 2014

(65) Prior Publication Data

US 2016/0071792 A1   Mar. 10, 2016

Related U.S. Application Data

(60) Provisional application No. 62/048,040, filed on Sep. 9, 2014.

(51) Int. Cl.

| H01L 23/48 | (2006.01) |
|---|---|
| H01L 21/308 | (2006.01) |
| H01L 27/11519 | (2017.01) |
| H01L 27/11524 | (2017.01) |
| H01L 27/11548 | (2017.01) |
| H01L 23/522 | (2006.01) |
| H01L 23/532 | (2006.01) |
| H01L 23/528 | (2006.01) |

(Continued)

(52) U.S. Cl.
CPC .... *H01L 21/3085* (2013.01); *H01L 27/11519* (2013.01); *H01L 27/11524* (2013.01); *H01L 27/11548* (2013.01); *H01L 21/0337* (2013.01); *H01L 21/32139* (2013.01); *H01L 23/528* (2013.01); *H01L 23/5222* (2013.01); *H01L 23/53295* (2013.01); *H01L 2924/0002* (2013.01)

(58) Field of Classification Search
CPC .......................... H01L 23/4952; H01L 21/4825
USPC ........................................................ 257/780
See application file for complete search history.

(56) References Cited

U.S. PATENT DOCUMENTS 8,183,148 B2   5/2012  Aburada et al.
2005/0077550 A1*  4/2005  Inaba ................ H01L 21/28132
                                                       257/250

(Continued)

FOREIGN PATENT DOCUMENTS

| JP | 2010-45302 | 2/2010 |
| JP | 2013-135202 | 7/2013 |
| JP | 2013-197266 | 9/2013 |

*Primary Examiner* — Elias M Ullah
(74) *Attorney, Agent, or Firm* — Oblon, McClelland, Maier & Neustadt, L.L.P.

(57) ABSTRACT

A semiconductor device according to the present embodiment includes a plurality of wires. A plurality of wire drawing pads are provided correspondingly to the wires and electrically connecting a plurality of contacts to the wires, respectively. First space portions widen toward a first direction from the wires to the wire drawing pads and are located between adjacent ones of the wire drawing pads in a connection region between the wires and the wire drawing pads. Second space portions are provided at edge portions of the wire drawing pads. Air gaps or insulating layers are provided in the first space portions and the second space portions.

4 Claims, 10 Drawing Sheets

(51) Int. Cl.
*H01L 21/033* (2006.01)
*H01L 21/3213* (2006.01)

(56) References Cited

U.S. PATENT DOCUMENTS

2013/0237051 A1   9/2013   Kikutani et al.
2013/0241072 A1   9/2013   Sato et al.

\* cited by examiner

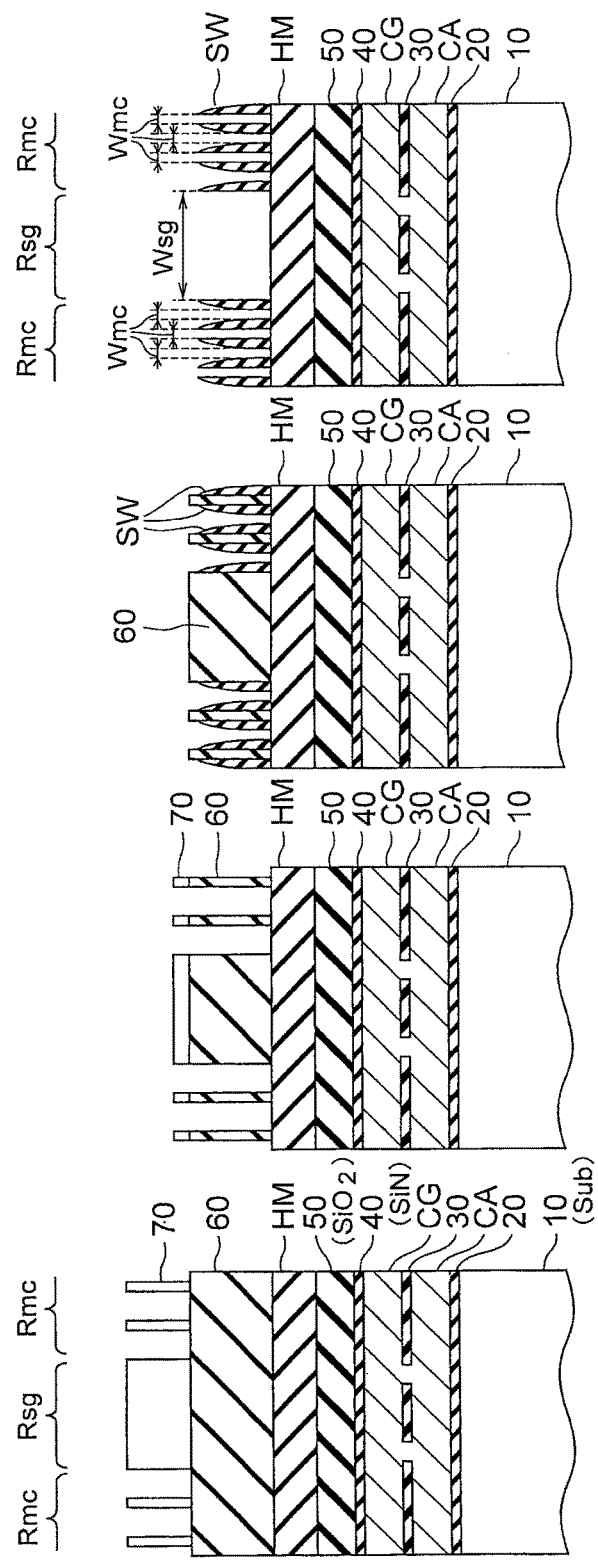

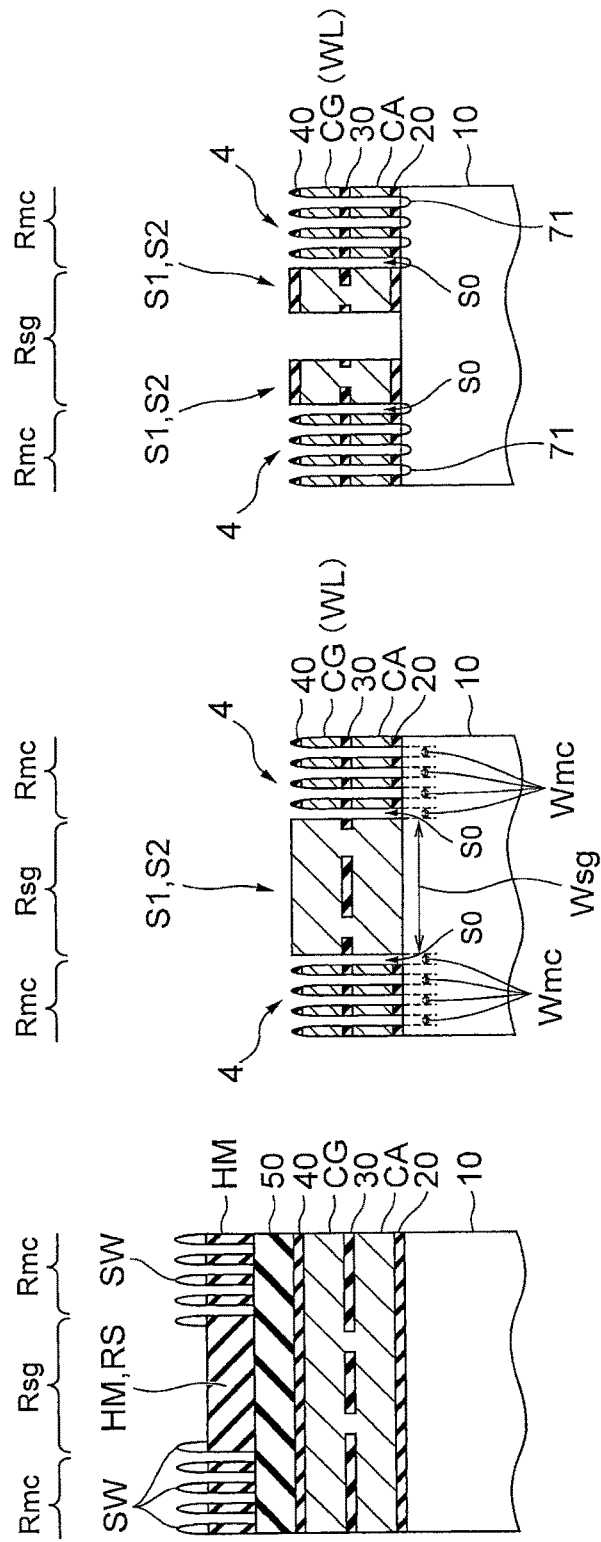

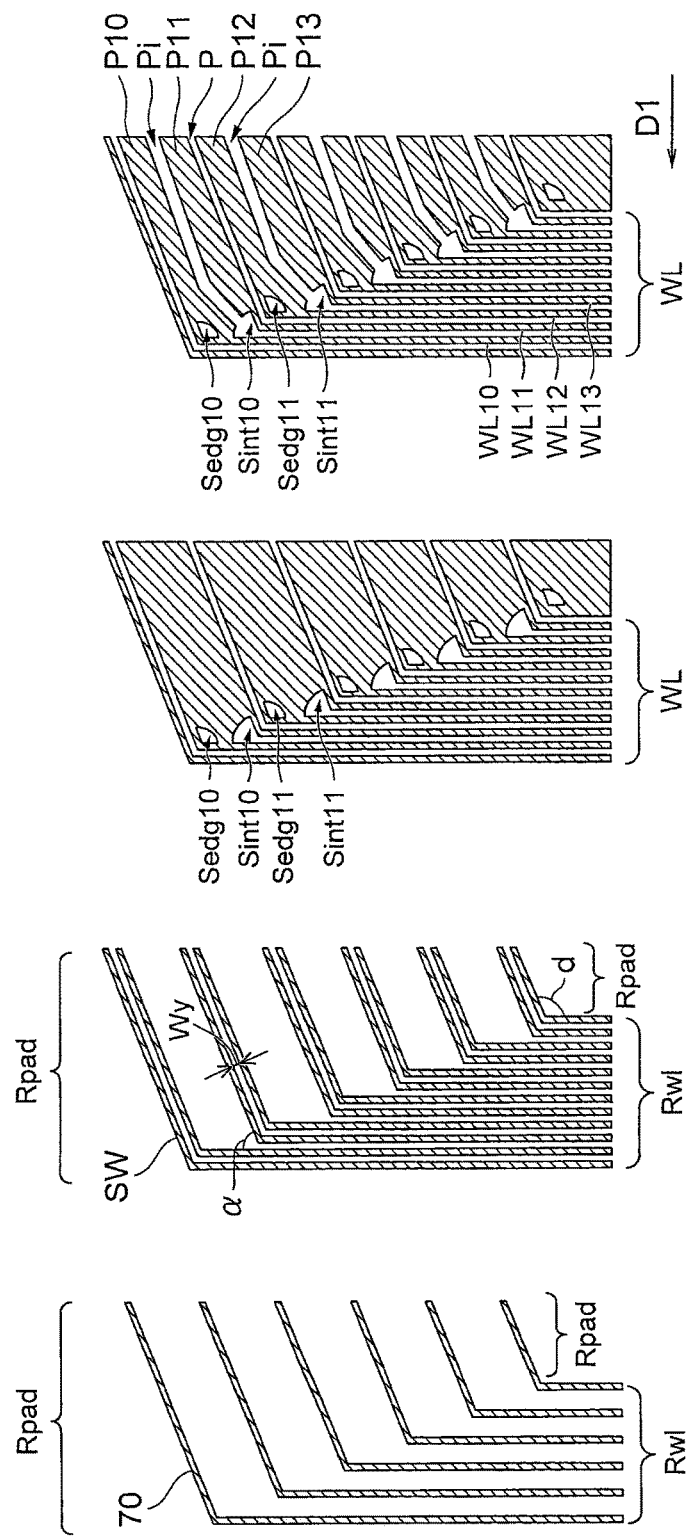

SEMICONDUCTOR DEVICE AND MANUFACTURING METHOD THEREOF

CROSS REFERENCE TO RELATED APPLICATIONS

This application is based upon and claims the benefit of priority from the prior U.S. Provisional Patent Application No. 62/048,040, filed on Sep. 9, 2014, the entire contents of which are incorporated herein by reference.

FIELD

The embodiments of the present invention relate to a semiconductor device and a manufacturing method thereof.

BACKGROUND

In recent years, to reduce the line width or the space width of a semiconductor device, a sidewall transfer method (hereinafter, also "double patterning method") using sidewall spacers has been developed. For example, in a NAND flash memory, a plurality of word lines are often formed using the double patterning method to set the interval between adjacent ones of the word lines to be equal to or smaller than the minimum processing dimension of a lithography technique. In such a NAND flash memory, the width of spaces (hereinafter, also denoted by S0) between memory strings each constituted of a plurality of memory cells connected in series and select gate transistors for selecting the memory strings is also increasingly reduced to an interval substantially equal to the interval between adjacent ones of the word lines. This is to suppress gouging of a semiconductor substrate at the spaces S0 and to further downscale the semiconductor device. To reduce the width of the spaces S0 to be as narrow as the interval between the word lines and to downscale the semiconductor device, the sidewall spacers also need to be formed narrow.

However, when the sidewall spacers are narrow, it is difficult to align a photoresist with the sidewall spacers at memory string ends at a lithography step for forming gates of the select gate transistors. For example, an alignment accuracy of an ArF immersion exposure machine is about ±10 to 15 nanometers. In this case, when the width of the sidewall spacers is below about 20 nanometers, it is difficult to align the photoresist with the sidewall spacers. If the photoresist is misaligned with the sidewall spacers at the memory string ends, the select gate transistors may be electrically disconnected from the memory strings or gates of memory cells at the memory string ends are connected to the gates of the select gate transistors.

BRIEF DESCRIPTION OF THE DRAWINGS

FIGS. 2A to 2G are cross-sectional views showing an example of a manufacturing method of a memory according to the present embodiment;
FIGS. 9A to 9D are layout charts showing an example of a manufacturing method of the memory according to the third embodiment.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor device includes a plurality of wires. A plurality of wire drawing pads are provided correspondingly to the wires and electrically connecting a plurality of contacts to the wires, respectively. First space portions widen toward a first direction from the wires to the wire drawing pads and are located between adjacent ones of the wire drawing pads in a connection region between the wires and the wire drawing pads. Second space portions are provided at edge portions of the wire drawing pads. Air gaps or insulating layers are provided in the first space portions and the second space portions.

Figure 1:
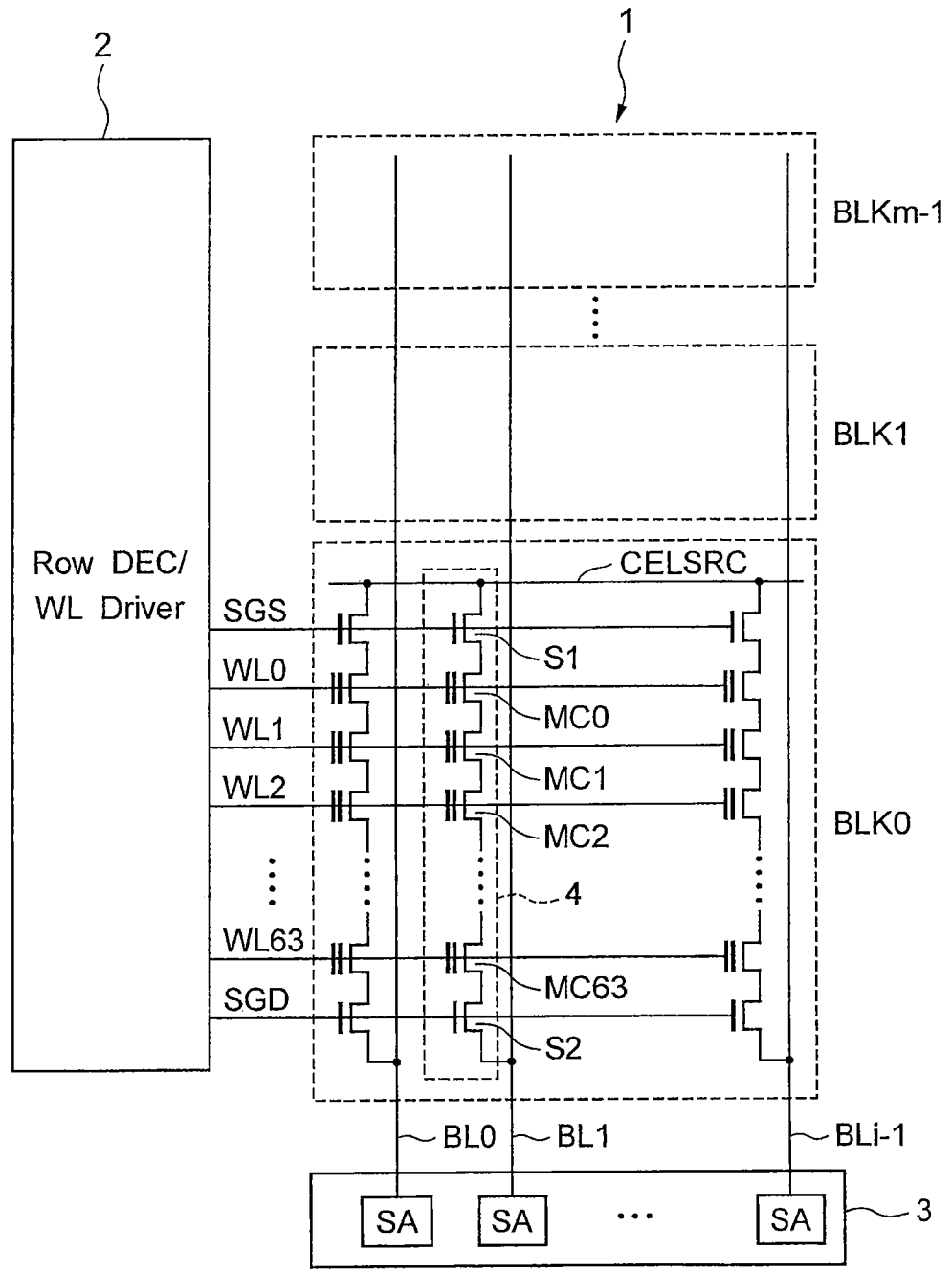
FIG. 1 shows a specific configuration of a cell array 1.

FIG. 1 shows a specific configuration of a cell array 1. In this example, NAND cell units (memory strings) 4 each include 64 memory cells MC0 to MC63 connected in series and select gate transistors S1 and S2 connected at both ends thereof, respectively. Sources of the select gate transistors S1 are connected to a common source line CELSRC and drains of the select gate transistors S2 are connected to bit lines BL (BL0 to BLi-1), respectively. The bit lines BL can be electrically connected to the memory cells MC in the memory strings 4 via the corresponding select gate transistors S2, respectively. Control gates of the memory cells MC0 to MC63 are connected to word lines WL (WL0 to WL63), respectively, and gates of the select gate transistors S1 and S2 are connected to select gate lines SGS and SGD, respectively.

A range of a plurality of the memory cells MC along one word line WL is a page as a unit of batch data read or batch data write. A range of a plurality of the memory strings 4 arranged in a direction of the word line WL constitutes a cell block BLK as a unit of batch data erase. In FIG. 1, a plurality of cell blocks BLK0 to BLKm-1 that share the bit lines BL are arrayed in a direction of the bit lines BL to form the cell array 1. The word lines WL and the select gate lines SGS and SGD are driven by a row decoder 2. The bit lines BL are connected to sense amplifier circuits SA in a page buffer 3, respectively.

FIGS. 2A to 2G are cross-sectional views showing an example of a manufacturing method of a memory according to the present embodiment. FIGS. 2A to 2G show a manufacturing method of a part including the ends of the memory string 4 between adjacent ones of the cell blocks BLK and the select gate transistors S1 or S2. The present embodiment is applicable not only to formation of the memory strings 4 and the select gate transistors S1 and S2 but also to an arbitrary semiconductor device in which fine patterns and wide patterns are mixed.

Materials of a tunnel dielectric film 20, a charge accumulation layer CA, an intergate dielectric film 30, control gates CG, a silicon nitride film 40, a silicon dioxide film 50, a hard mask HM, and a core 60 are first formed sequentially on a semiconductor substrate 10.

The semiconductor substrate 10 is, for example, a silicon substrate. The tunnel dielectric film 20 is an insulating film such as a silicon dioxide film. The tunnel dielectric film 20 is formed, for example, by thermally oxidizing the semiconductor substrate 10. The charge accumulation layer CA is made of a conductive material such as doped polysilicon. The charge accumulation layer CA is deposited on the tunnel dielectric film 20, for example, by a CVD (Chemical Vapor Deposition) method. The intergate dielectric film 30 is made of, for example, a silicon dioxide film, a silicon nitride film, or a high dielectric material (HfSiO, for example) having a higher relative permittivity than the silicon dioxide film and the silicon nitride film. The intergate dielectric film 30 is deposited on the tunnel dielectric film 20 also, for example, by the CVD method. The intergate dielectric film 30 is removed partially between the control gates CG and the charge accumulation layer CA at the select gate transistors S1 or S2 to electrically connect the control gates CG and the charge accumulation layer CA to each other as integrated gate electrodes. The control gates CG are made of a conductive material such as doped polysilicon. The silicon nitride film 40 and the silicon dioxide film 50 function as a hard mask during processing of the control gates CG, the intergate dielectric film 30, and the charge accumulation layer CA. The silicon nitride film 40 and the silicon dioxide film 50 are also processing target materials to be processed using the hard mask HM as a mask.

It suffices that the hard mask HM serving as a first mask material is a material that enables selective etching of the silicon nitride film 40 and the silicon dioxide film 50 and the hard mask HM is made of, for example, polysilicon.

The core 60 is used in the double patterning method using sidewall spacers (denoted by SW in FIG. 2C) serving as a second mask material. The core 60 is formed, for example, using an insulating film such as a silicon dioxide film or a silicon nitride film.

Next, a photoresist 70 is formed on the core 60 by a lithography technique. The photoresist 70 can be formed in the minimum processing dimension of the lithography technique. A region Rsg in FIG. 2A is a formation region of the select gate transistors S1 or S2. Regions Rmc are formation regions of the memory cells MC.

The core 60 is then processed by a RIE (Reactive Ion Etching) method using the photoresist 70 as a mask as shown in FIG. 2B.

After the photoresist 70 is removed, a material of the sidewall spacers SW is deposited on upper surfaces and side surfaces of the cores 60 and on the hard mask HM. At that time, the material of the sidewall spacers SW is formed not to fill gaps between the cores 60. The material of the sidewall spacers SW can be a material that enables selective etching of the hard mask HM and can be an insulating film such as a silicon dioxide film or a silicon nitride film.

Next, the material of the sidewall spacers SW is etched back by the RIE method, whereby the material of the sidewall spacers SW deposited on the upper surfaces of the cores 60 and on the hard mask MH is removed while the sidewall spacers SW are left on the both side surfaces of the cores 60 as shown in FIG. 2C.

The cores 60 are then selectively removed using wet etching or the like. Accordingly, the sidewall spacers SW serving as the second mask material are formed on the hard mask HM serving as the first mask material as shown in FIG. 2D.

While performed only once in the present embodiment, formation of the sidewall spacers SW can be performed plural times. For example, sidewall spacers (not shown) can be further formed on side surfaces of the sidewall spacers SW using the sidewall spacers SW as a core. By repeating sidewall spacer formation in this way, the line width and the space width can be formed in narrower patterns.

Next, the hard mask HM serving as the first mask material is etched by the RIE method using the sidewall spacers SW serving as the second mask material as a mask.

When a material such as polysilicon is to be etched, the RIE method set in a predetermined treatment condition etches the material and simultaneously generates depositions. A larger quantity of depositions is generated when the area of a region to be etched is larger. When this characteristic of the RIE method is used, a region in which the hard mask HM is removed by etching and a region in which the hard mask HM and the depositions are left can be controlled based on an interval of mask patterns as shown in FIG. 3.

Figure 3:
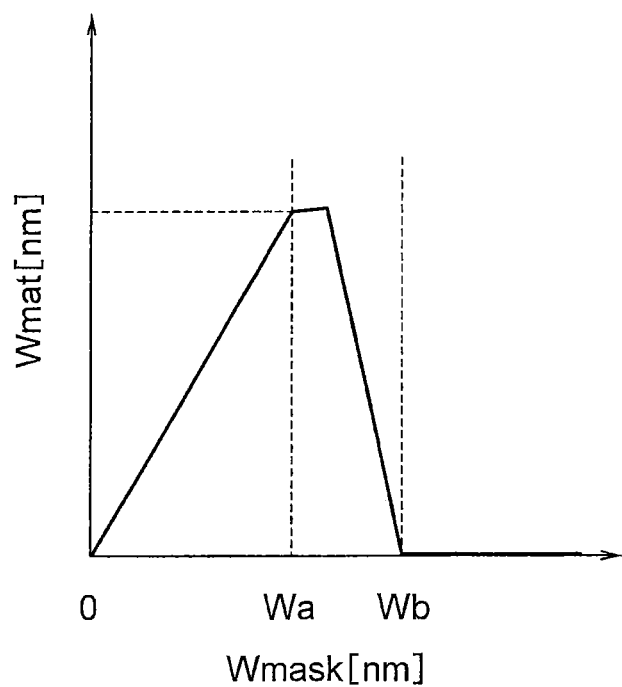
FIG. 3 is a graph showing a relation between the interval Wmask of the sidewall spacers SW and the interval Wmat of the hard mask HM after processing.

FIG. 3 is a graph showing a relation between the interval (the space width) Wmask of the sidewall spacers SW and the interval (the space width) Wmat of the hard mask HM after processing. According to the graph, when the space width Wmask of the sidewall spacers SW is equal to or smaller than a first width Wa, the space width Wmat of the hard mask HM after processing changes (almost proportionally) with the space width Wmask of the sidewall spacers SW. That is, in this case, an etching rate of the hard mask HM is larger than a deposition rate of depositions adhering to the hard mask HM and the space width Wmat increases correspondingly when the space width Wmask increases.

On the other hand, when the space width Wmask of the sidewall spacers SW exceeds the first width Wa, more depositions are generated and thus an increase in the space width Wmat is slowed or the space width Wmat conversely starts decreasing even when the space width Wmask increases. When the space width Wmask of the sidewall spacers SW is equal to or larger than a second width Wb (Wa<Wb), the space width Wmat of the hard mask HM is filled with the depositions or the hard mask HM. Accordingly, the space width Wmat becomes zero. This is because the etching rate of the hard mask HM becomes smaller than the deposition rate of the depositions adhering to the hard mask HM.

When the hard mask HM is processed by the RIE method having characteristics as shown in FIG. 3, an interval Wmc between adjacent ones of the sidewall spacers SW in the memory cell regions Rmc as first regions is assumed to be equal to or smaller than the first width Wa. Meanwhile, an interval Wsg between adjacent ones of the sidewall spaces SW in the select gate transistor region Rsg as a second region is assumed to be equal to or larger than the second width Wb. Accordingly, after the hard mask HM is processed, the processed hard mask HM conforms to the patterns of the sidewall spacers SW in the memory cell regions Rmc while the hard mask HM in the select gate transistor region Rsg becomes a state where depositions RS or the hard mask HM is filled or left between the sidewall spacers SW as shown in FIG. 2E. Therefore, the hard mask HM between adjacent ones of the sidewall spacers SW is removed to expose the silicon dioxide film 50 in the regions Rmc. On the other hand, the hard mask HM between adjacent ones of the sidewall spacers SW is left between the sidewall spacers SW or the etching depositions RS are filled between the sidewall spacers SW in the region Rsg. Therefore, the hard mask HM between adjacent ones of the sidewall spacers SW is left or covered by the etching depositions RS in the region Rsg.

The space widths (Wmc and Wsg, for example) of the sidewall spacers SW are preferably not set to a range of a transition region between the first width Wa and the second width Wb. When the space widths of the sidewall spacers SW are between the first width Wa and the second width Wb, removal or leaving of the hard mask HM and the depositions RS is difficult to control, which causes an unpredictable failure.

Next, the silicon dioxide film 50 and the silicon nitride film 40 are processed as a processing target material by the RIE method using the hard mask HM as a mask. The control gates CG, the intergate dielectric film 30, and the charge accumulation layer CA are then processed as a processing target material by the RIE method using the hard mask HM, the silicon dioxide film 50, and/or the silicon nitride film 40 as a mask. The charge accumulation layers CA and the control gate CG are thereby separated for the memory cells MC, respectively, in the regions Rmc as shown in FIG. 2F. The control gates CG function also as the word lines WL. Therefore, it can be said that the word lines WL are formed at an interval of the width Wmc narrower than the minimum processing dimension of the lithography technique. Meanwhile, the parts corresponding to the gate electrodes of the select gate transistors S1 or S2 are left in a state of having the width Wsg in the region Rsg.

In the present embodiment, the lithography technique is not used during processing of the hard mask HM and gate structures (the control gates CG, the intergate dielectric film 30, and the charge accumulation layer CA) below the hard mask HM. The hard mask HM is processed (patterned) in a self-aligned manner using the RIE method having the characteristics as shown by the graph of FIG. 3. Therefore, while the hard mask HM is processed, the alignment accuracy at the lithography step does not need to be considered and no misalignment in exposure occurs. In the present embodiment, the word lines WL in the regions Rmc, the gate electrodes in the region Rsg, and the spaces S0 between the regions Rmc and Rsg can be thereby formed in a self-aligned manner without using the lithography technique. As a result, the interval of the word lines. WL and the spaces S0 can be further narrowed according to the present embodiment.

Furthermore, because the alignment accuracy at the lithography step does not need to be considered during processing of the hard mask HM and the gate structures, the width of the spaces S0 can be formed almost equal to the interval of adjacent ones of the word lines WL. This suppresses the gouging of the semiconductor substrate 10 as mentioned above.

Next, the gate electrodes of the select gate transistors S1 or S2 are separated using the lithography technique and the RIE method as shown in FIG. 2G. The gate electrodes of two parallel select gate transistors S1 or S2 included in adjacent ones of the blocks BLK (FIG. 1) are thereby formed. For example, between the blocks BLK0 and BLK1 in FIG. 1, the select gate transistor S1 included in the block BLK0 and the select gate transistor S1 included in the block BLK1 are formed in parallel. The gate electrodes of the two select gate transistors shown in FIG. 2G correspond to, for example, the gate electrodes of these two select gate transistors S1.

Next, impurities are implanted to the semiconductor substrate 10 using the word lines WL and the gate electrodes of the select gate transistors S1 or S2 as a mask, thereby forming diffusion layers 71.

An interlayer dielectric film (not shown) is then deposited between the word lines WL and between the gate electrodes of the select gate transistors S1 or S2. An interlayer dielectric film, contacts, wires, and the like (not shown) are further formed, whereby the memory according to the present embodiment is completed.

According to the present embodiment, the hard mask HM, the silicon dioxide film 50, the silicon nitride film 40, the control gates CG (the word lines WL), the intergate dielectric film 30, and the charge accumulation layer CA are processed (patterned) in a self-aligned manner without using the lithography technique. Therefore, misalignment at the lithography step does not need to be considered and thus the interval between the word lines WL and the spaces S0 can be narrowed. Furthermore, the width of the spaces S0 can be set almost equal to the interval between the word lines WL.

To realize the self-aligned patterning as mentioned above, the space width between the sidewall spacers SW of the patterns to be removed by the RIE method needs to be equal to or smaller than the first width Wa and the space width between the sidewall spacers SW of the patterns to be left by the RIE method needs to be equal to or larger than the second width Wb. A planar layout of regions where drawing pads for the word lines WL are to be formed also needs to be designed based on such conditions. The drawing pads (hereinafter, also "wire drawing pads") for the word lines WL are provided to correspond to the word lines WL and electrically connect a plurality of contacts to the word lines WL, respectively. The wire drawing pads are formed in a same layer as the word lines WL (that is, the control gates CG) and are formed wider than the word lines WL to receive contact plugs, respectively. Specific examples of a planar layout of the wire drawing pads are shown in the following embodiments.

First Embodiment

Figure 4:
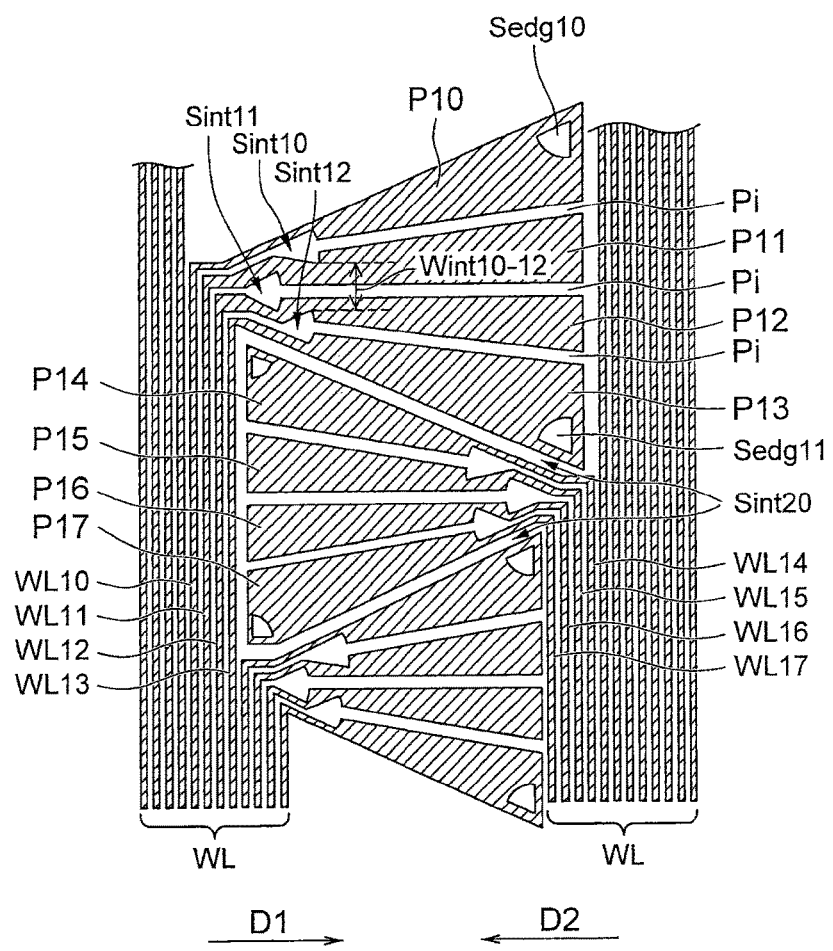
FIG. 4 is a layout chart showing an example of a configuration of the wire drawing pads of the memory according to the first embodiment.

FIG. 4 is a layout chart showing an example of a configuration of the wire drawing pads of the memory according to the first embodiment. The memory according to the first embodiment includes a plurality of word lines WL10 to WL17 and a plurality of wire drawing pads P10 to P17.

The word lines WL as wires are arrayed at a space width equal to or smaller than the first width Wa.

The wire drawing pads P10 to P17 are provided to correspond to the word lines WL10 to WL17 electrically insulated from each other, respectively. The wire drawing pads P10 to P17 are formed wider than the word lines WL10 to WL17 to be capable of being in contact at upper surfaces thereof with the contacts (not shown), respectively. An interlayer dielectric film (not shown) is provided on the wire drawing pads P10 to P17 and the contacts pass through the interlayer dielectric film to be in contact with the wire drawing pads P10 to P17, respectively. The wire drawing pads P10 to P17 thereby enable the contacts to be electrically connected to the word lines WL10 to WL17, respectively.

In the first embodiment, the wire drawing pads P10 to P17 form substantially triangular shapes in groups of four. For example, the wire drawing pads P10 to P13 form a substantially triangular shape. The wire drawing pads P14 to P17 also form a substantially triangular shape. Substantially triangular patterns constituted of the wire drawing pads are arrayed in such a manner that orientations thereof to the extension direction of the word lines WL are alternated. For example, the substantially triangular shape constituted of the wire drawing pads P14 to P17 and the substantially triangular shape constituted of the wire drawing pads P10 to P13 have a symmetrical relation with respect to an axis of the extension direction of the word lines WL and are deviated from each other in the extension direction of the word lines WL. The substantially triangular shape constituted of the wire drawing pads P10 to P13 is formed to widen toward a first direction D1. On the other hand, the adjacent substantially triangular shape constituted of the wire drawing pad P14 to P17 is formed to widen toward a second direction D2 opposite to the first direction D1. The substantially triangular shape of the wire drawing pads P14 to P17 is smaller than the substantially triangular shape of the wire drawing pads P10 to P13 by a wiring region of the word lines WL.

Between adjacent ones of the wire drawing pads P10 to P13 constituting the substantially triangular pattern, a plurality of interpad space portions (first space portions) Sint10 to Sint12 are provided, respectively. A plurality of edge space portions (second space portions) Sedg10 and Sedg11 are provided at edges of the wire drawing pads P10 and P13, respectively.

The interpad space portions Sint10 to Sint12 are provided in a connection region between the word lines WL10 to WL13 and the wire drawing pads P10 to P13. For example, interpad space portion Sint10 is provided between the wire drawing pads P10 and P11. The interpad space portion Sint11 is provided between the wire drawing pads P11 and P12. The interpad space portion Sint12 is provided between the wire drawing pads P12 and P13.

The interpad space portions Sint10 to Sint12 widen toward the first direction D1 from the word lines WL10 to WL13 to the wire drawing pads P10 to P13. Therefore, the interpad space portions Sint10 to Sint12 have substantially fan shapes or substantially triangle shape widening toward the first direction D1, respectively. Vertices of the fans or triangles of the interpad space portions Sint10 to Sint12 on the side of the word lines WL are formed at acute angles (0 to 90 degrees), respectively. This is to enlarge the areas of the interpad space portions Sint10 to Sint12, which will be explained below. Furthermore, widths of the interpad space portions (fan shape poritions) Sint10 to Sint12 in the vicinity of the word lines WL10 to WL13 are wider than widths of the interpad space portions Sint10 to Sint12 in a separate area from the word lines WL10 to WL13 (portions separating from fan shape poritions).

The areas of the interpad space portions Sint10 to Sint12 are preferably larger than an allowable range of misalignment of isolation patterns Pi for isolating the wire drawing pads P10 to P13 from each other. At a lithography step for isolating the wire drawing pads P10 to P13 from each other, alignment with each of the interpad space portions Sint10 to Sint12 is required. At that time, the large areas of the interpad space portions Sint10 to Sint12 enable the isolation patterns Pi to be easily aligned with the interpad space portions Sint10 to Sint12, respectively. In this way, the wire drawing pads P10 to P13 can be reliably isolated from each other using the lithography technique.

Furthermore, the interpad space portion Sint11 between the second wire drawing pad P11 and the third wire drawing pad P12 is located nearer the word lines WL10 to WL13 corresponding to the wire drawing pads P10 to P13 than the interpad space portion Sint10 between the first wire drawing pad P10 and the second wire drawing pad P11 and the interpad space portion Sint12 between the third wire drawing pad P12 and the fourth wire drawing pad P13.

In this arrangement of the wire drawing pads P10 to P13, the isolation pattern Pi between the wire drawing pads P11 and P12 needs to pass through between the interpad space portion Sint10 and the interpad space portion Sint12 to reach the interpad space portion Sint11 without being in contact with the interpad space portion Sint10 and the interpad space portion Sint12. Therefore, an interval Wint10-12 between the interpad space portion Sint10 and the interpad space portion Sint12 is preferably larger than the width of the allowable misalignment range of the isolation patterns Pi. That is, the interpad space portion Sint10 is preferably separated from the interpad space portion Sint12 by more than the width of the allowable misalignment range of the lithography technique.

The edge space portions Sedg10 and Sedg11 are respectively provided at two vertices distant from the word lines WL10 to WL13 corresponding to the wire drawing pads P10 to P13 among three vertices (edges) of the substantially triangular pattern formed of the wire drawing pads P10 to P13.

Shapes and areas of the edge space portions Sedg10 and Sedg11 can be almost equal to the shapes and areas of the interpad space portions Sint10 to Sint12. However, the edge space portions Sedg10 and Sedg11 do not have a function of isolating the wire drawing pads or isolating the word lines WL. Therefore, the shapes and areas of the edge space portions Sedg10 and Sedg11 are not particularly limited and can be arbitrarily set.

While being different in sizes and orientations from those of the substantially triangular pattern constituted of the wire drawing pads P10 to P13, the substantially triangular pattern constituted of the wire drawing pads P14 to P17 and other substantially triangular patterns have identical modes.

Interpad space portions (third space portions) Sint20 between one substantially triangular pattern and another substantially triangular pattern extend with a substantially uniform width. For example, the interpad space portion Sint20 between the wire drawing pads P13 and P14 extends with a substantially uniform width without having a fan shape space as the interpad space portions Sint10 to Sint12. In the first embodiment, the interpad space portions Sint20 are provided for every four wire drawing pads constituting a substantially triangular pattern in the connection region between the word lines WL and the wire drawing pads.

Figure 5:
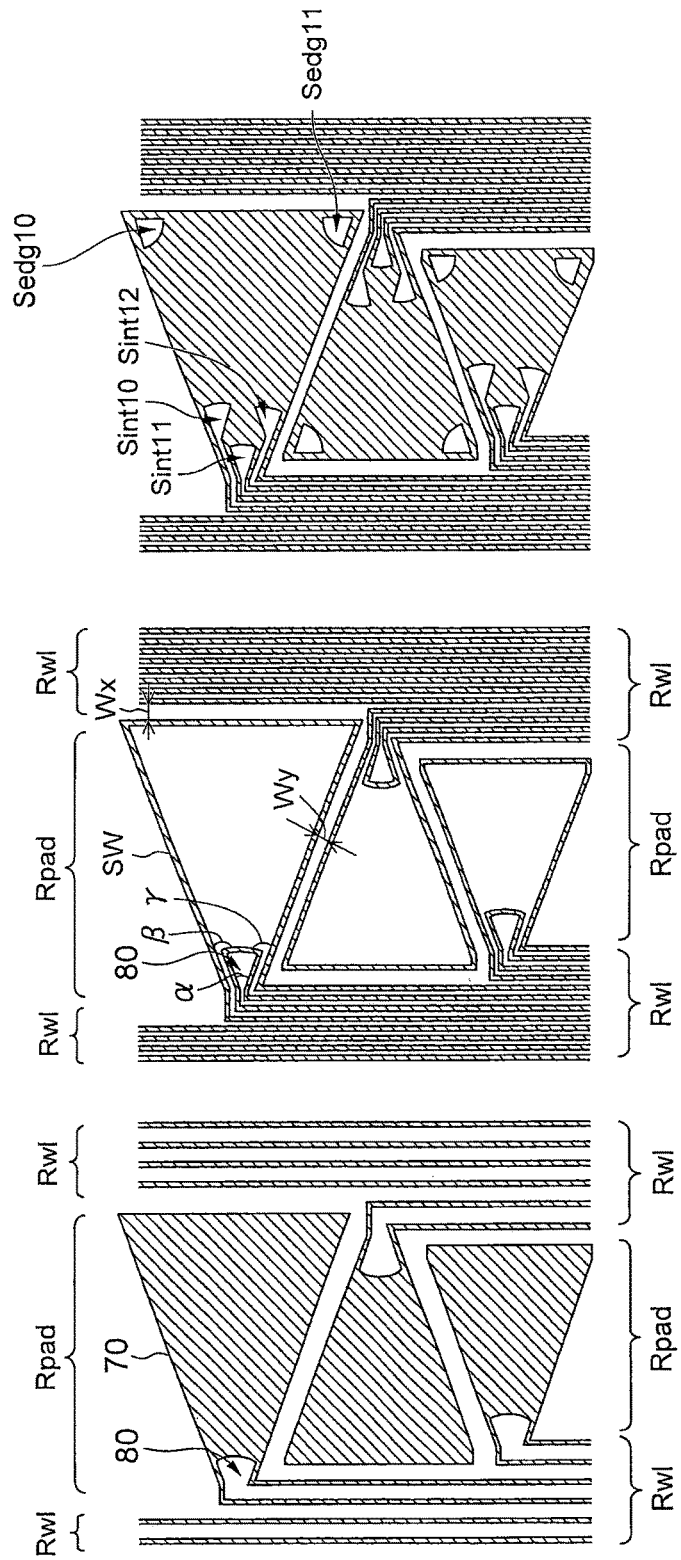
FIGS. 5A to 5C are layout charts showing an example of a manufacturing method of the memory according to the first embodiment.

FIGS. 5A to 5C are layout charts showing an example of a manufacturing method of the memory according to the first embodiment. In FIGS. 5A to 5C, planar layouts of formation regions Rpad of the wire drawing pads and formation regions Rwl of the word lines WL are shown.

Steps explained with reference to FIG. 2A are first performed and the photoresist 70 is patterned on the core 60 using the lithography technique. Patterns shown in FIG. 5A are thereby obtained by the photoresist 70. At that time, shapes of the photoresist 70 in the formation regions Rpad of the wire drawing pads are substantially triangular. The photoresist 70 is not formed in substantially fan shape regions 80 corresponding to the interpad space portion Sint11.

Next, steps explained with reference to FIGS. 2B to 2D are performed and the sidewall spacers SW are formed on the hard mask HM. Patterns shown in FIG. 5B are thereby obtained by the sidewall spacers SW. At that time, shapes of the sidewall spacers SW in the formation regions Rpad of the wire drawing pads are substantially triangular along outer edges of the photoresist 70. An interval Wx between the sidewall spacers SW in the formation regions Rpad of the wire drawing pads and the sidewall spacers SW in the formation regions Rwl of the word lines WL is set equal to or smaller than the first width Wa. An interval (an interval between substantially triangular shapes) Wy between a sidewall spacer SW corresponding to a certain wire drawing pad and a sidewall spacer SW corresponding to another wire drawing pad is also set equal to or smaller than the first width Wa.

In regions between the formation regions Rpad of the wire drawing pads and the formation regions Rwl of the word lines WL, the sidewall spacers SW have the substantially fan shape regions 80, respectively.

An angle $\alpha$ of each vertex of the substantially fan shape regions 80 and exterior angles $\beta$ and $\gamma$ are set to acute angles (0 to 90 degrees), respectively. By setting the angles $\alpha$, $\beta$, and $\gamma$ to acute angles, a range in which the intervals are equal to or smaller than the first width Wa is widened and the areas of the interpad space portions Sint10 to Sint12 can be enlarged, respectively. Accordingly, at a lithography step explained later, the isolation patterns Pi for the wire drawing pads can be easily aligned with the interpad space portions Sint10 to Sint12, respectively.

Next, steps explained with reference to FIGS. 2D to 2E are performed and the hard mask HM is etched by the RIE method. At that time, the hard mask HM and the like are etched using the RIE method having the characteristics explained with reference to FIG. 3. That is, the hard mask HM is processed according the patterns of the sidewall spacers SW in regions in which the space width is equal to or smaller than the first width Wa. The hard mask HM or depositions are left in regions in which the space width is equal to or larger than the second width Wb. Patterns shown in FIG. 5C are thereby obtained by the hard mask HM and a structure located thereunder.

The formation regions Rpad of the wire drawing pads are covered by the hard mask HM or the depositions except for three vertex portions of each of the substantially triangular shapes of the sidewall spacers SW. This is because the space width is equal to or larger than the second width Wb in many parts of regions inside of the substantially triangular shapes of the sidewall spacers SW. Meanwhile, at the three vertex portions of each of the substantially triangular shapes of the sidewall spacers SW, the hard mask HM is removed in a range in which the space width is equal to or smaller than the first width Wa. Furthermore, also at each vertex of the substantially fan shape regions 80, the hard mask HM is removed in a range where the space width is equal to or smaller than the first width Wa. The interpad space portions Sint10 to Sint12 and the edge space portions Sedg10 and Sedg11 are thereby formed as shown in FIG. 5C.

Because the interval Wx is equal to or smaller than the first width Wa, the hard mask HM between the sidewall spacers SW in the formation regions Rpad of the wire drawing pads and the sidewall spacers SW in the formation regions Rwl of the word lines WL is removed. Furthermore, because the interval Wy is also equal to or smaller than the first width Wa, the hard mask HM between the sidewall spacer SW corresponding to a certain wire drawing pad and the sidewall spacer SW corresponding to another wire drawing pad is also removed. Needless to mention, the hard mask HM between adjacent ones of the word lines WL is also removed.

Next, the silicon dioxide film 50, the silicon nitride film 40, and the gate structures (the control gates CG, the intergate dielectric film 30, and the charge accumulation layer CA) under the hard mask HM are etched using the hard mask HM as a mask.

The isolation patterns Pi are then formed by the lithography technique and the RIE method, thereby isolating the wire drawing pads P10 to P13 from each other to correspond to the word lines WL10 to WL13, respectively, as shown in FIG. 4. At that time, the isolation patterns Pi are patterned to extend in the first direction D1 to reach the interpad space portions Sint10 to Sint12 on a planar layout, respectively. As explained with reference to FIG. 5B, the areas of the interpad space portions Sint10 to Sint12 are relatively large and are, for example, larger than the area of the allowable misalignment range. Accordingly, the isolation patterns Pi can be easily aligned with the interpad space portions Sint10 to Sint12, respectively, at the lithography step. By processing the wire drawing pads in this way, the word lines WL and the wire drawing pads P10 to P17 are formed in the patterns shown in FIG. 4.

Next, an interlayer dielectric film (not shown) is deposited on the word lines WL and the wire drawing pads P10 to P17. The interlayer dielectric film is thereby filled in the interpad space portions Sint10 to Sint12 and the edge space portions Sedg10 and Sedg11. Alternately, air gaps may be provided in the interpad space portions Sint10 to Sint12 and the edge space portions Sedg10 and Sedg11. In this case, the interlayer dielectric film is deposited on the word lines WL and the wire drawing pads P10 to P17 so as not to bury the interpad space portions Sint10 to Sint12 and the edge space portions Sedg10 and Sedg11.

An interlayer dielectric film, contact plugs, wires, and the like are then further formed, whereby the memory according to the first embodiment is completed.

According to the first embodiment, while the lithography technique is used for formation of the isolation patterns Pi, the word lines WL and the wire drawing pads P10 to P17 can be processed in the self-aligned manner in the formation regions Rpad of the wire drawing pads. That is, by using the layout according to the first embodiment, the self-aligned processing method of the hard mask HM and the like can be applied to the formation regions Rwl of the word lines WL and the formation regions Rpad of the wire drawing pads.

Furthermore, according to the first embodiment, because the interpad space portions Sint10 to Sint12 are provided, alignment of the isolation patterns Pi can be easily performed at the lithography step for isolating the wire drawing pads.

Second Embodiment

Figure 6:
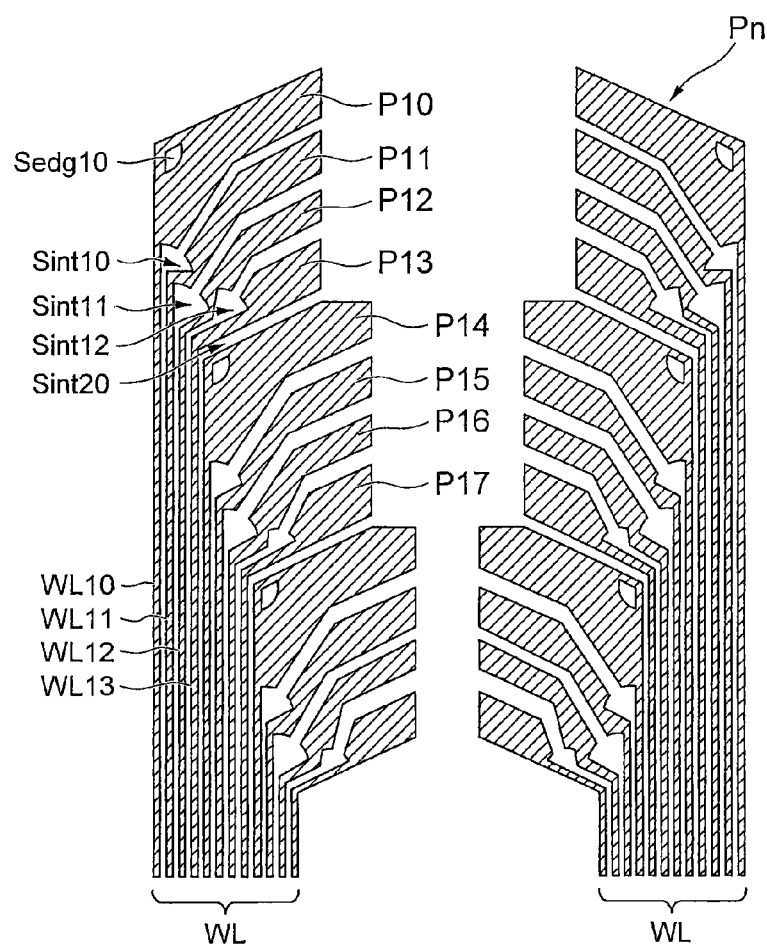
FIG. 6 is a layout chart showing an example of a configuration of wire drawing pads of a memory according to a second embodiment.

FIG. 6 is a layout chart showing an example of a configuration of wire drawing pads of a memory according to a second embodiment. In the memory according to the second embodiment, shapes of the wire drawing pads P10 to P17 are formed in rectangles or polygons having more than four sides. When the shapes of the wire drawing pads P10 to P17 are triangles as in the first embodiment, the wire drawing pads P10 to P17 have layouts that widen as the distances from the word lines WL10 to WL17 increase. In contrast thereto, when the shapes of the wire drawing pads P10 to P17 are formed in rectangles or polygons having more than four sides as in the second embodiment, the wire drawing pads P10 to P17 can be formed to be substantially uniform in the width or to be narrowed regardless of the distances from the word lines WL10 to WL17. In this way, according to the second embodiment, layout areas of the wire drawing pads P10 to P17 can be reduced by enhancing flexibility in the layout shapes of the wire drawing pads P10 to P17.

The interpad space portions Sint10 to Sint12 are provided between adjacent ones of the wire drawing pads P10 to P13, respectively. The shapes, arrangement, and functions of the interpad space portions Sint10 to Sint12 are identical to those in the first embodiment.

The edge space portion Sedg10 is provided at an edge of the wire drawing pad P10. A shape and arrangement of the edge space portion Sedg10 depends on a substantially rectangular or polygonal shape constituted of the wire drawing pads P10 to P13. That is, the shape and arrangement are determined whether the interval between the sidewall spacers SW during processing of the hard mask HM is equal to or smaller than the first width Wa or equal to or larger than the second width Wb.

The memory according to the second embodiment also includes other wire drawing pads Pn that have a symmetrical relation with the wire drawing pads P10 to P17 with respect to an axis of the extension direction of the word lines WL.

The interpad space portions (third space portions) Sint20 between a substantially rectangular pattern and another substantially rectangular pattern extend with a substantially uniform width similarly to those in the first embodiment. The interpad space portions Sint20 do not have a fan shape space as the interpad space portions (the first space portions) Sint10 to Sint12 and extend with a substantially uniform width.

Other configurations of the second embodiment can be identical to corresponding ones of the first embodiment. Therefore, the second embodiment can achieve effects identical to those of the first embodiment. In addition, in the second embodiment, the layout areas of the wire drawing pads P10 to P17 can be further reduced.

FIGS. 7A to 7D are layout charts showing an example of a manufacturing method of the memory according to the second embodiment. FIGS. 7A to 7D show only left half of the wire drawing pads shown in FIG. 6 and a configuration of right half thereof is not shown for the sake of convenience.

Figure 7:
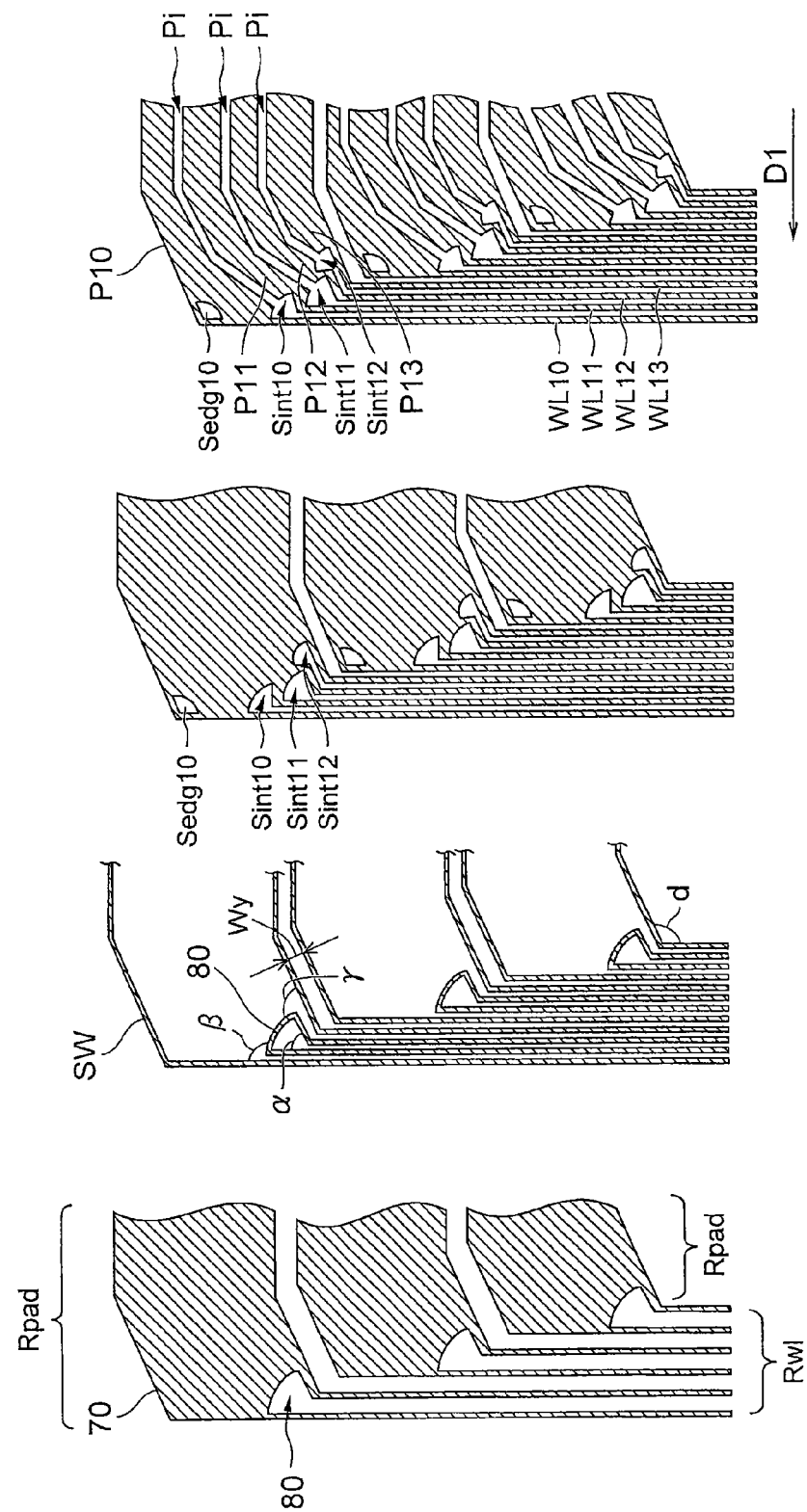
FIGS. 7A to 7D are layout charts showing an example of a manufacturing method of the memory according to the second embodiment.

The steps explained with reference to FIG. 2A are first performed and the photoresist 70 is patterned on the core 60. Patterns shown in FIG. 7A are thereby obtained by the photoresist 70. At that time, the shapes of the photoresist 70 in the formation regions Rpad of the wire drawing pads are rectangles or polygons having more than four sides. The photoresist 70 is not formed in the substantially fan shape regions 80 corresponding to the interpad space portion Sint11.

Next, the steps explained with reference to FIGS. 2B to 2D are performed and the sidewall spacers SW are formed on the hard mask HM. Patterns shown in FIG. 7B are thereby obtained by the sidewall spaces SW. At that time, the shapes of the sidewall spacers SW in the formation regions Rpad of the wire drawing pads are rectangles or polygons along outer edges of the photoresist 70. The interval Wy between the sidewall spacer SW corresponding to a certain wire drawing pad and the sidewall spacer SW corresponding to another wire drawing pad is equal to or smaller than the first width Wa.

In regions between the sidewall spacers SW in the formation regions Rpad of the wire drawing pads and the sidewall spacers SW in the formation regions Rwl of the word lines WL, the sidewall spacers SW have the substantially fan shape regions 80, respectively.

The angle α of each vertex of the substantially fan shape regions 80 and exterior angles β and γ are set to acute angles (0 to 90 degrees), respectively. By setting the angles α, β, and γ to acute angles, the range in which the interval Wy is equal to or smaller than the first width Wa is widened and the areas of the interpad space portions Sint10 to Sint12 can be increased, respectively. Accordingly, the isolation patterns Pi for the wire drawing pads can be easily aligned with the interpad space portions Sint10 to Sint12, respectively, at a lithography step explained later.

Furthermore, by setting an angle d of the sidewall spacers SW between the formation regions Rwl of the word lines WL and the formation regions Rpad of the wire drawing pads to be larger than 90 degrees, the angles α, β, and γ can be set to be acute angles more easily. Therefore, it is also preferable to set the angle d to be larger than 90 degrees.

Next, the steps explained with reference to FIGS. 2D to 2E are performed and the hard mask HM is etched by the RIE method. At that time, the hard mask HM is etched using the characteristics of the RIE method explained with reference to FIG. 3. That is, the hard mask HM is processed according to the patterns of the sidewall spacers SW in regions in which the space width is equal to or smaller than the first width Wa. The hard mask HM or depositions are left in regions in which the space width is equal to or larger than the second width Wb. Patterns shown in FIG. 7C are thereby obtained by the hard mask HM.

The formation regions Rpad of the wire drawing pads are covered by the hard mask HM or the depositions except for the vertex portions. This is because the space width is equal to or larger than the second width Wb in many parts of regions inside of the rectangles or polygons of the sidewall spacers SW. Meanwhile, at the vertex portions of the sidewall spacers SW, the hard mask HM is removed in a range in which the space width is equal to or smaller than the first width Wa. Accordingly, the hard mask HM is removed at the vertex portions of the formation regions Rpad of the wire drawing pads. Furthermore, the hard mask HM is also removed in a range in which the space width is equal to or smaller than the first width Wa at each vertex of the substantially fan shape regions 80. The interpad space portions Sint10 to Sint12 and the edge space portions Sedg10 are thereby formed as shown in FIG. 7C. The areas of the interpad space portions Sint10 to Sint12 and the edge space portions Sedg10 can be identical to those in the first embodiment.

Because the interval Wy in FIG. 7B is equal to or smaller than the first width Wa, the hard mask HM between the sidewall spacer SW corresponding to a certain wire drawing pad and the sidewall spacer SW corresponding to another wire drawing pad is removed. Needless to mention, the hard mask HM between adjacent ones of the word lines WL is also removed.

Next, the silicon dioxide film 50, the silicon nitride film 40, and the gate structures (the control gates CG, the intergate dielectric film 30, the charge accumulation layer CA, and the like) under the hard mask HM are etched using the hard mask HM as a mask.

The isolation patterns Pi are then formed by the lithography technique and the RIE method, thereby isolating the wire drawing pads P10 to P13 from each other to correspond to the word lines WL10 to WL13, respectively, as shown in FIG. 7D. The isolation patterns Pi are formed to reach the interpad space portions Sint10 to Sint12 on a planar layout, respectively. As explained with reference to FIG. 7B, the areas of the interpad space portions Sint10 to Sint12 are relatively large. Accordingly, the isolation patterns Pi can be easily aligned with the interpad space portions Sint10 to Sint12, respectively, at the lithography step. By processing the wire drawing pads in this way, the word lines WL and the wire drawing pads P10 to P13 are formed in the patterns as shown in FIG. 7D.

Next, the wire drawing pads are processed to divide the wire drawing pads adjoining in a direction orthogonal to the extension direction of the word lines WL using the lithography technique and the RIE method. By processing the wire drawing pads in this way, the word lines WL and the wire drawing pads P10 to P13 are formed in patterns shown in FIG. 6.

Next, an interlayer dielectric film (not shown) is deposited on the word lines WL and the wire drawing pads P10 to P13. The interpad space portions Sint10 to Sint12 and the edge space portions Sedg10 are thereby filled with the interlayer dielectric film. Alternately, air gaps may be provided in the interpad space portions Sint10 to Sint12 and the edge space portions Sedg10 and Sedg11. In this case, the interlayer dielectric film is deposited on the word lines WL and the wire drawing pads P10 to P17 so as not to bury the interpad space portions Sint10 to Sint12 and the edge space portions Sedg10 and Sedg11.

An interlayer dielectric film, contact plugs, wires, and the like are then formed, whereby the memory according to the second embodiment is completed.

The second embodiment can reduce the layout areas of the wire drawing pads P10 to P17 by setting the layout shapes of the wire drawing pads P10 to P17 to be rectangles or polygons. Furthermore, the second embodiment can achieve effects identical to those of the first embodiment.

Third Embodiment

Figure 8:
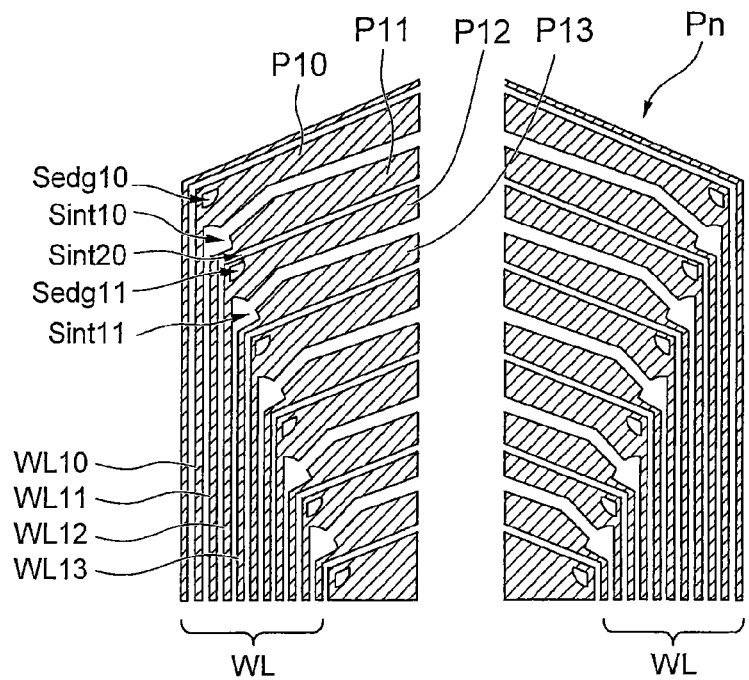
FIG. 8 is a layout chart showing an example of a configuration of wire drawing pads of a memory according to a third embodiment.

FIG. 8 is a layout chart showing an example of a configuration of wire drawing pads of a memory according to a third embodiment. The memory according to the third embodiment is similar to that according to the second embodiment in that shapes of the wire drawing pads P10 and P11 are formed in substantially rectangular shapes (parallelograms, for example) or polygonal shapes. However, the memory according to the third embodiment is different from that according to the second embodiment in that the two wire drawing pads P10 and P11 are formed in a substantially rectangular shape or polygonal shape as a set. Therefore, in the third embodiment, the two wire drawing pads P10 and P11 and two wire drawing pads P12 and P13 form substantially rectangular shapes or polygonal shapes, respectively.

Associated therewith, in the third embodiment, one interpad space portion Sint10 is provided for a set of the wire drawing pads P10 and P11. The interpad space portion Sint10 is provided between the wire drawing pads P10 and P11. The interpad space portion Sint11 is provided between the wire drawing pads P12 and P13.

The edge space portions Sedg10 and Sedg11 are provided at edges of the wire drawing pads P10 and P12, respectively. Shapes and arrangement of the edge space portions Sedg10 and Sedg11 depend on the shapes of the substantially rectangular or polygonal shapes constituted of the wire drawing pads P10 and P11 and the wire drawing pads P12 and P13. That is, the shapes and arrangement are determined whether the interval between the sidewall spaces SW is equal to or smaller than the first width Wa or is equal to or larger than the second width Wb during processing of the hard mask HM.

The memory according to the third embodiment includes other wire drawing pads Pn that have a symmetrical relation with the wire drawing pads P10 to P13 with respect to an axis in the extension direction of the word lines WL.

The interpad space portions (the third space portions) Sint20 between a substantially rectangular pattern and another substantially rectangular pattern extend, for example, between the wire drawing pads P11 and P12. The interpad space portions Sint20 extend with a substantially uniform width without having a fan shape space as the interpad space portions (the first space portions) Sint10 and Sint11. In the third embodiment, the interpad space portions Sint20 are provided for every two wire drawing pads constituting a substantially rectangular pattern in a connection region between the word lines WL and the wire drawing pads.

Other configurations of the third embodiment can be identical to corresponding ones of the second embodiment. Therefore, the third embodiment can achieve effects identical to those of the second embodiment. Furthermore, also in the third embodiment, flexibility in the layout shapes of the wire drawing pads P10 to P17 can be enhanced, so that the third embodiment can achieve effects identical to those of the second embodiment.

FIGS. 9A to 9D are layout charts showing an example of a manufacturing method of the memory according to the third embodiment. FIGS. 9A to 9D show only left half of the wire drawing pads shown in FIG. 8 and a configuration of right half thereof is not shown for the sake of convenience.

The steps explained with reference to FIG. 2A are first performed and the photoresist 70 is patterned on the core 60. Patterns shown in FIG. 9A are thereby obtained by the photoresist 70. At that time, shapes of the photoresist 70 in the formation regions Rpad of the wire drawing pads and the formation regions Rwl of the word lines WL are both substantially linear.

Next, the steps explained with reference to FIGS. 2B to 2D are performed and the sidewall spacers SW are formed on the hard mask HM. Patterns shown in FIG. 9B are thereby obtained by the sidewall spacers SW. At that time, shapes of the sidewall spacers SW in the formation regions Rpad of the wire drawing pads are substantially linear along outer edges of the photoresist 70. The interval Wy between the sidewall spacer SW corresponding to a certain wire drawing pad and the sidewall spacer SW corresponding to another wire drawing pad is set to be equal to or smaller than the first width Wa.

In regions in which the sidewall spacers SW in the formation regions Rpad of the wire drawing pads are connected to the sidewall spacers SW in the formation regions Rwl of the word lines WL, the sidewall spacers SW bend at an angle α with respect to the extension direction of the word lines WL. The angle α is set to an acute angle (0 to 90 degrees). By setting the angle α to an acute angle, the range in which the space width is equal to or smaller than the first width Wa is widened and the areas of the interpad space portions Sint10 and Sint11 can be increased. Accordingly, the isolation patterns Pi for the wire drawing pads can be easily aligned with the interpad space portions Sint10 and Sint11, respectively, at a lithography step explained later.

Furthermore, by setting an angle d formed by the sidewall spacers SW between the formation regions Rwl of the word lines WL and the formation regions Rpad of the wire drawing pad to be larger than 90 degrees, the angle α can be more easily set to an acute angle. Therefore, it is also preferable to set the angle d to be larger than 90 degrees.

Next, the steps explained with reference to FIGS. 2D to 2E are performed and the hard mask HM is etched by the RIE method. At that time, the hard mask HM is etched using the characteristics of the RIE method explained with reference to FIG. 3. That is, the hard mask HM is processed according to the patterns of the sidewall spacers SW in regions in which the space width is equal to or smaller than the first width Wa. The hard mask HM or depositions are left in regions in which the space width is equal to or larger than the second width Wb. Patterns shown in FIG. 9C are thereby obtained by the hard mask HM.

The formation regions Rpad of the wire drawing pads are covered by the hard mask HM or the depositions except for the bent portions. This is because the space width is equal to or larger than the second width Wb in many parts of the formation regions Rpad of the wire drawing pads. Meanwhile, at the bent portions of the sidewall spacers SW, the hard mask HM is removed in a range in which the space width is equal to or smaller than the first width Wa. The hard mask HM is thereby removed in a substantially fan shape at corner portions of the wire drawing pad formation regions Rpad. The interpad space portions Sint10 and Sint11 and the edge space portions Sedg10 and Sedg11 are thereby formed as shown in FIG. 9C. The areas of the interpad space portions Sint10 and Sint11 and the edge space portions Sedg10 and Sedg11 can be identical to those in the first embodiment.

Because the interval Wy in FIG. 9B is equal to or smaller than the first width Wa, the hard mask HM between the sidewall spacer SW in a wire drawing pad formation region Rpad and the sidewall spacer SW in another wire drawing pad formation region Rpad is removed. Needless to mention, the hard mask HM between adjacent ones of the word lines WL is also removed.

Next, the silicon dioxide film 50, the silicon nitride film 40, and the gate structures (the control gates CG, the intergate dielectric film 30, the charge accumulation layer CA, and the like) under the hard mask HM are etched using the hard mask HM as a mask.

The isolation patterns Pi are then formed by the lithography technique and the RIE method, thereby isolating the wire drawing pads P10 to P13 from each other to correspond to the word lines WL10 to WL13, respectively, as shown in FIG. 9D. The isolation patterns Pi are formed to extend in the first direction D1 to reach the interpad space portions Sint10 and Sint11, respectively, on a planar layout. As explained with reference to FIG. 9B, the areas of the interpad space portions Sint10 and Sint11 are relatively large. Accordingly, the isolation patterns Pi can be easily aligned with the interpad space portions Sint10 and Sint11, respectively, at the lithography step. In this way, the word lines WL and the wire drawing pads P10 to P13 are formed in patterns shown in FIG. 9D by processing the wire drawing pads.

Next, the wire drawing pads are processed to divide the wire drawing pads adjoining in a direction orthogonal to the extension direction of the word lines WL using the lithography technique and the RIE method. Through the processing of the wire drawing pads, the word lines WL and the wire drawing pads P10 to P13 are formed in patterns shown in FIG. 8.

Next, an interlayer dielectric film (not shown) is deposited on the word lines WL and the wire drawing pads P10 to P13. The interpad space portions Sint10 and Sint11 and the edge space portions Sedg10 and Sedg11 are thereby filled with the interlayer dielectric film. Alternately, air gaps may be provided in the interpad space portions Sint10 and Sint11 and the edge space portions Sedg10 and Sedg11. In this case, the interlayer dielectric film is deposited on the word lines WL and the wire drawing pads P10 to P17 so as not to bury the interpad space portions Sint10 and Sint11 and the edge space portions Sedg10 and Sedg11.

An interlayer dielectric film, contact plugs, wires, and the like are then formed, whereby the memory according to the third embodiment is completed.

The third embodiment can reduce the layout areas of the wire drawing pads P10 to P13 by setting the layout shapes of the wire drawing pads P10 to P13 to be substantially rectangular or polygonal shapes.

The photoresist 70 and the sidewall spaces SW have the shapes substantially linear and relatively simple and thus can be formed relatively easily. Furthermore, in the third embodiment, because the two wire drawing pads P10 and P11 are formed as a set in a rectangle or polygon, the interpad space portion Sint10 and the edge space portion Sedg10 also have the shapes relatively simple and can be easily formed. Accordingly, the alignment of the isolation patterns Pi at the lithography step can be further facilitated. Furthermore, the third embodiment can achieve effects identical to those of the second embodiment.

The interpad space portions and the edge space portions in the embodiments mentioned above can be easily found through an analysis of a planar layout of drawing pad portions for the word lines WL using a SEM (Scanning Electron Microscope) or a TEM (Transmission Electron Microscope).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a plurality of wires;
   a plurality of wire drawing pads corresponding to the wires and electrically connecting a plurality of contacts to the wires;
   first space portions widening toward a first direction from the wires to the wire drawing pads and located between adjacent ones of the wire drawing pads in a connection region between the wires and the wire drawing pads;
   second space portions at edge portions of the wire drawing pads;
   air gaps or insulating layers provided in the first space portions and the second space portions; and
   third space portions extending with a substantially uniform width for every n (n is an integer equal to larger than 2) of the wire drawing pads in the connection region between the wires and the wire drawing pads.

2. A semiconductor device comprising:
   a plurality of wires;
   a plurality of wire drawing pads corresponding to the wires and electrically connecting a plurality of contacts to the wires;
   first space portions widening toward a first direction from the wires to the wire drawing pads and located between adjacent ones of the wire drawing pads in a connection region between the wires and the wire drawing pads;
   second space portions at edge portions of the wire drawing pads; and
   air gaps or insulating layers provided in the first space portions and the second space portions, wherein
   areas of the first space portions are larger than an area of an allowable misalignment range at a lithography step.

3. A semiconductor device comprising:
   a plurality of wires;

a plurality of wire drawing pads corresponding to the wires and electrically connecting a plurality of contacts to the wires;

first space portions widening toward a first direction from the wires to the wire drawing pads and located between adjacent ones of the wire drawing pads in a connection region between the wires and the wire drawing pads;

second space portions at edge portions of the wire drawing pads; and air gaps or insulating layers provided in the first space portions and the second space portions, wherein the first space portions are located between adjacent ones of four of the wire drawing pads arranged in an order of a first wire drawing pad, a second wire drawing pad, a third wire drawing pad, and a fourth wire drawing pad, and the first space portion between the second wire drawing pad and the third wire drawing pad is closer to the wires than the first space portion between the first wire drawing pad and the second wire drawing pad and the first space portion between the third wire drawing pad and the fourth wire drawing pad.

4. The device of claim 3, wherein the first space portion between the first wire drawing pad and the second wire drawing pad is distant from the first space portion between the third wire drawing pad and the fourth wire drawing pad by more than a width of an allowable misalignment range at a lithography step.

\* \* \* \* \*